(12) United States Patent
Tanno et al.

(10) Patent No.: US 8,083,123 B2
(45) Date of Patent: Dec. 27, 2011

(54) METHOD FOR MANUFACTURING A PRINTED WIRING BOARD

(75) Inventors: Katsuhiko Tanno, Gifu (JP); Youichirou Kawamura, Gifu (JP)

(73) Assignee: IBIDEN Co., Ltd., Ogaki-shi (JP)

( * ) Notice: Subject to any disclaimer, the term of this patent is extended or adjusted under 35 U.S.C. 154(b) by 862 days.

(21) Appl. No.: 12/093,436

(22) Filed: May 12, 2008

(65) Prior Publication Data

US 2009/0120680 A1    May 14, 2009

Related U.S. Application Data

(63) Continuation of application No. PCT/JP2007/051274, filed on Jan. 26, 2007.

(30) Foreign Application Priority Data

Jan. 27, 2006  (JP) .................................. 2006-019522

(51) Int. Cl.
*B23K 31/02*    (2006.01)
*H01L 21/44*    (2006.01)

(52) U.S. Cl. .................... 228/180.22; 228/215; 438/613

(58) Field of Classification Search .................. None
See application file for complete search history.

(56) References Cited

U.S. PATENT DOCUMENTS

| | | | |
|---|---|---|---|
| 5,921,458 A | 7/1999 | Fan | |
| 2002/0058406 A1 | 5/2002 | Mukuno et al. | |
| 2006/0157540 A1 | 7/2006 | Sumita et al. | |
| 2007/0096327 A1 * | 5/2007 | Kawamura et al. | 257/774 |
| 2008/0078810 A1 | 4/2008 | Kawamura et al. | |
| 2008/0107863 A1 * | 5/2008 | Ikeda et al. | 428/137 |
| 2008/0128872 A1 * | 6/2008 | Schepers | 257/664 |
| 2008/0170819 A1 * | 7/2008 | Kodama et al. | 385/14 |
| 2008/0227240 A1 * | 9/2008 | Sharma et al. | 438/113 |
| 2008/0236876 A1 * | 10/2008 | Kodama et al. | 174/260 |
| 2008/0251917 A1 * | 10/2008 | Chu et al. | 257/738 |
| 2009/0053459 A1 * | 2/2009 | Hirose et al. | 428/76 |
| 2009/0294516 A1 * | 12/2009 | Sawa et al. | 228/246 |
| 2009/0314537 A1 * | 12/2009 | Hirose et al. | 174/263 |
| 2010/0032200 A1 * | 2/2010 | Hirose et al. | 174/261 |
| 2011/0061232 A1 * | 3/2011 | Kawamura et al. | 29/832 |

FOREIGN PATENT DOCUMENTS

JP    03-265150    11/1991

(Continued)

OTHER PUBLICATIONS

U.S. Appl. No. 12/120,046, filed May 13, 2008, Tanno.

(Continued)

*Primary Examiner* — Kiley Stoner
(74) *Attorney, Agent, or Firm* — Oblon, Spivak, McClelland, Maier & Neustadt, L.L.P.

(57) ABSTRACT

A method of manufacturing a printed wiring board having at least one solder bump includes forming a solder resist layer on a conductor layer. The solder resist layer has at least one opening that exposes a connection pad of the conductor layer, and the at least one opening in the solder resist layer has a depth D, from the solder resist layer to the exposed connection pad, of from 3 μm to 18 μm. The method also includes loading a solder ball into each of the at least one opening in the solder resist layer, and forming a bump on the exposed connection pad by heating the solder ball to a reflow temperature.

17 Claims, 15 Drawing Sheets

FOREIGN PATENT DOCUMENTS

| | | |
|---|---|---|
| JP | 08-020682 | 1/1996 |
| JP | 09-326412 | 12/1997 |
| JP | 2000-077837 | 3/2000 |
| JP | 2001-267731 | 9/2001 |
| JP | 2002-151539 | 5/2002 |
| JP | 2005-057223 | 3/2005 |
| WO | 2006/013742 | 2/2006 |

OTHER PUBLICATIONS

U.S. Appl. No. 12/120,076, filed May 13, 2008, Tanno, et al.
Office Action issued on Sep. 1, 2010, in Taiwanese Patent Application No. 096102452.

* cited by examiner (A)

| D2 (μm) | SR opening diameter: 60 μm | SR opening diameter: 80 μm | Presence or absence of a void inside a solder bump |
|---|---|---|---|
| | Solder ball diameter: 70 μm | Solder ball diameter: 110 μm | |
| 3 | 100% | 100% | Absent |
| 7 | 100% | 100% | Absent |
| 15 | 100% | 100% | Absent |
| 20 | 82% | 89% | Present |

US 8,083,123 B2

METHOD FOR MANUFACTURING A PRINTED WIRING BOARD

CROSS REFERENCE TO RELATED APPLICATIONS

This application is a continuation of PCT/JP2007/051274, filed Jan. 26, 2007, which claims priority to Japanese Patent Application No. 2006-019522, filed Jan. 27, 2006, the entire contents of each of which is incorporated herein by reference.

BACKGROUND OF THE INVENTION

1. Field of the Invention

This invention pertains to a method of manufacturing a printed wiring board, and in particular, relates to a method of manufacturing a printed wiring board that can be used for a package substrate for mounting an integrated circuit (IC) chip.

2. Discussion of the Background

In a conventional method, solder bumps are used for an electrical connection between a package substrate and an IC chip. Solder bumps are conventionally formed with the following steps.
(1) A step of printing flux on connection pads formed in a package substrate.
(2) A step of loading solder balls on the connection pads with flux printed thereon.
(3) A step of forming solder bumps out of solder balls by reflow.

An IC chip is placed on solder bumps after the solder bumps are formed on a package substrate and the solder bumps and the pads (terminals) on the IC chip are connected by reflow such that the IC chip is mounted on the package substrate. For the above-described step of loading solder balls on connection pads, a printing technology using concurrently a ball arrangement mask and a squeegee is illustrated in Japanese Patent Document Laid-open patent No. 2001-267731, the entire content of which is incorporated herein by reference.

SUMMARY OF THE INVENTION

Accordingly, one object of this invention is to provide a novel method of manufacturing a printed wiring board having at least one solder bump thereon. The method includes forming a solder resist layer on a conductor layer. The solder resist layer has at least one opening that exposes a connection pad of the conductor layer, and the at least one opening in the solder resist layer has a depth D, from the solder resist layer to the exposed connection pad, of from 3 μm to 18 μm. The method also includes loading a solder ball into each of the at least one opening in the solder resist layer, and forming a bump on the exposed connection pad by heating the solder ball to a reflow temperature.

Another object of this invention is to provide a novel method of manufacturing a printed wiring board having at least one solder bump thereon. The method includes forming a solder resist layer having at least one opening that exposes a connection pad. The at least one opening in the solder resist layer has a depth D from the solder resist layer to the exposed connection pad. The method also includes loading a solder ball into each of the at least one opening in the solder resist layer, and forming a bump on the exposed connection pad by heating the solder ball to a reflow temperature. The depth D of the opening in the solder resist layer is selected and meet the following equation:

$$D \leq R - \sqrt{R^2 - (W/2)^2}$$

where R is a radius of the solder ball and W is a diameter of the opening in the solder resist layer.

A further object of this invention is to provide a novel printed wiring board comprising: a substrate having a plurality of connection pads; a solder resist layer formed on the substrate having a plurality of openings corresponding to a respective one of the plurality of connection pads; and a plurality of solder bumps each formed in a respective opening and in contact with each of said respective one of the plurality of connection pads, wherein a depth of each opening meets the following equation:

$$D \leq R - \sqrt{R^2 - (W/2)^2}.$$

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 12(A) is a side cut-away view of a solder ball loading apparatus according to an embodiment of the present invention.

FIG. 14 is a table with solder ball loading yield test results; and

DETAILED DESCRIPTION OF EMBODIMENTS

However, in the conventional method, small-diameter solder balls end up being smaller than sand grains, and with the method of using concurrently a ball arrangement mask and a squeegee as described in Japanese Patent Document Laid-open patent No. 2001-267731, solder balls may become deformed by the squeegee, leading to an unevenness of solder balls in height resulting in lower product qualities. Namely, smaller diameters of solder balls mean lower weight to surface area ratios, giving rise to an adsorption phenomenon of solder balls due to intermolecular force, which causes sticking or clinging of the solder balls. In accordance with the conventional technology, since solder balls susceptible to sticking or clinging come in contact with a squeegee, solder balls are damaged resulting in portions thereof missing, for example. When portions of solder balls are missing, it gives rise to the unevenness in height among solder bumps as described in the above since the volume of a solder bump on each of the connection pads varies.

And, on the other hand, with highly integrated IC chips there has been, with respect to printed wiring boards for package, a demand for smaller diameters for connection pads onto which solder bumps are loaded. Conversely, there is a demand for the height of solder bumps to be connected to connections pads to be increased. Namely, differences in thermal expansion coefficients between the IC chip and the printed wiring board made of a resin may cause stress between the IC chip and the printed wiring board at said solder bump, and the stress may be more easily absorbed when the height of the solder bump is high.

Figure 15:
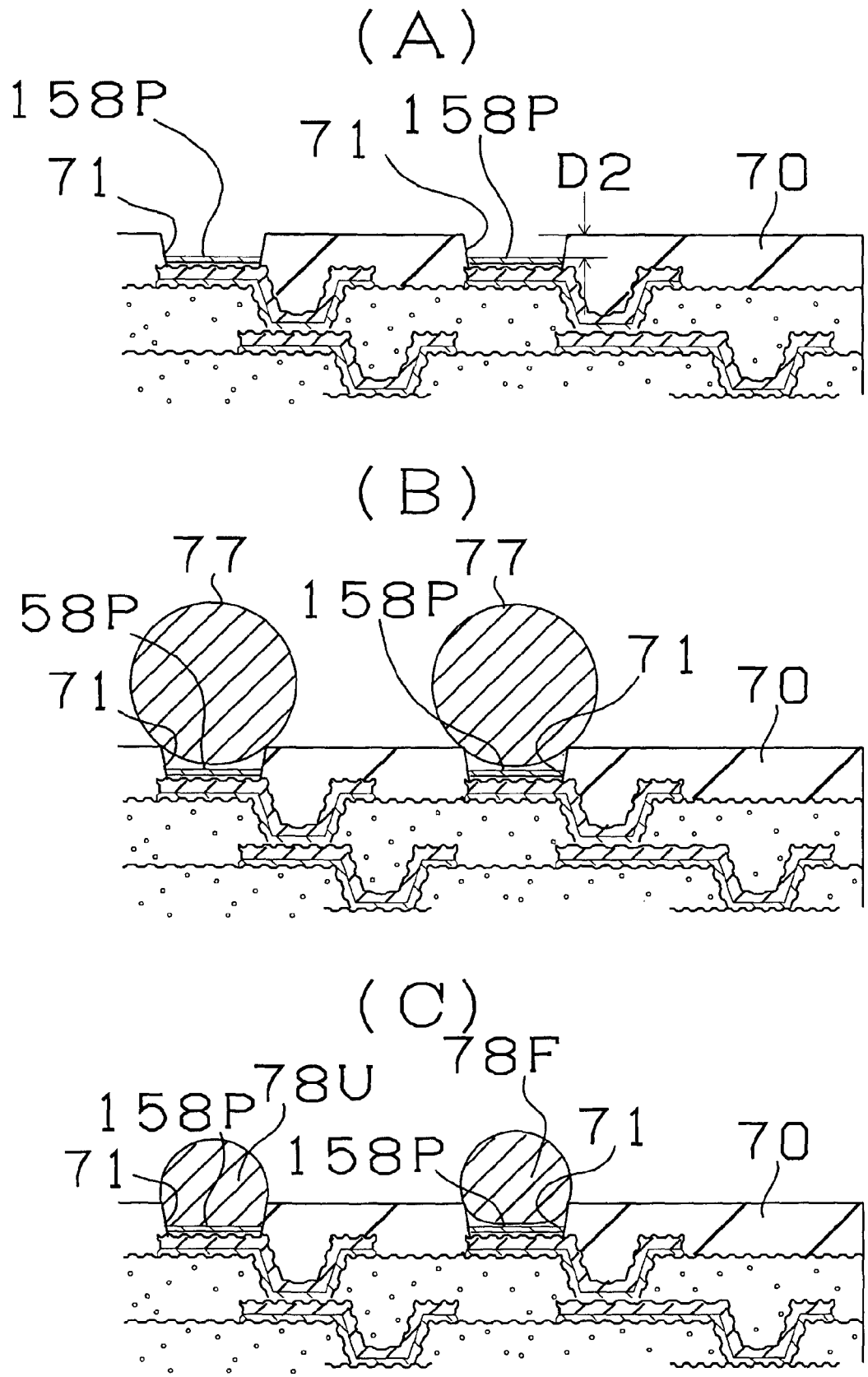
FIG. 15(A) is a side cut-away view of a step of forming a solder resist in a conventional method.
FIG. 15(B) is a side cut-away view of a step of loading a solder ball in an opening according to a conventional method.
FIG. 15(C) is a side cut-away view of solder bumps after reflow according to a conventional method.

Accordingly, in a conventional method there were provided, as illustrated in FIG. 15 (A), openings 71 in a solder resist layer 70 such that small diameter connection pads 158P are uncovered, and there were loaded, as illustrated in FIG. 15 (B), relatively large solder balls 77 on the small diameter connection pads 158P, and solder bumps were formed by reflow as illustrated in FIG. 15 (C). As a result of this, it was learned that there occurred, in addition to the solder bumps 78U connected to the connection pads 158P, solder bumps 78F that were not seated on and not connected to the connection pads 158P.

One of the objectives of the present invention is to provide a method of manufacturing a printed wiring board on which bumps that are high in height can with certainty be formed on the small-diameter connection pads (conductor circuits that are exposed from the solder resist layer) provided in the openings in the solder resist.

One embodiment of a method of manufacturing a printed wiring board having bumps comprises at least the following steps (a) through (c):

(a) a step of forming a solder resist layer having openings wherein the depth from an upper edge of the solder resist layer to the surface of a connection pad to be exposed is 3 to 18 μm;

(b) a step of loading into said openings metal balls having a low melting point (i.e., solder balls); and (c) a step of forming bumps out of the metal balls having a low melting point on the above-described connection pads by reflow.

In the first embodiment, relatively large metal balls having a low melting point are loaded into small-diameter openings in a solder resist. Bumps being high in height are formed out of metal balls having a low melting point in the small-diameter openings in the solder resist. The present inventors have recognized that as the thickness of the solder resist layer is adjusted such that the depth from the upper edge of the openings to the surfaces of the connection pads are 3 to 18 μm, and the distance between the metal balls having a low melting point loaded in the openings and the connection pads is brought close, the connection between the solder bumps and the connection pads can be more reliably obtained when the metal balls having a low melting point (solder balls) are reflowed. On the other hand, if the depth of the openings exceeds 18 μm, the metal balls having a low melting point become susceptible, when they are loaded, to becoming hung up on the upper edge faces of the solder resist openings such that they are occasionally not loaded in the openings. Further, when the metal balls having a low melting point are reflowed, occasionally the connection between the solder bumps and the connection pads cannot be obtained as the metal balls having a low melting point and the connection pads are too far apart. Alternately, if the depth of the openings is less than 3 μm, the ability of the openings to act as a dam is reduced and the metal having a low melting point may flow out when the metal balls having a low melting point are reflowed, resulting in the reflowed metal coming in contact with metal having a low melting point on an adjacent connection pads and creating a short circuit. And, since solder balls are susceptible to bouncing over the solder resist while being transported, etc., there are occasions that the solder balls are not loaded on the connection pads.

In another second embodiment of the method, the thickness of the solder resist layer is adjusted such that the metal balls having a low melting point are in contact with the connection pads when they are loaded in the openings. The connection between the solder bumps and the connection pads can be more reliably obtained upon reflow since metal balls having a low melting point loaded in the openings are in contact with the connection pads.

In yet another embodiment of the invention, metal balls having a low melting point are gathered with the use of a mask provided with opening portions corresponding to the openings in the solder resist layer and with a cylinder member being located above the mask and the air being sucked in from said cylinder member, and the metal balls having a low melting point gathered directly below the cylinder member by the above-described cylinder member or the printed wiring board and the mask being moved relative to each other in a horizontal direction are dropped into the openings of the solder resist layer via the opening portions of the mask. Accordingly, this enables fine metal balls having a low melting point to be more reliably loaded in all the openings of the solder resist layer. And, because the metal balls having a low melting point (solder balls) are moved by suction, the metal balls having a low melting point can be loaded in the openings without being damaged (or minimizing damage), unlike the case using a squeegee to move the solder balls, allowing the height of the bumps to be uniform. Further, this enables metal balls having a low melting point to be properly placed in the openings even on a printed wiring board with a much undulated surface such as a built-up multilayer wiring board.

Solder Ball Loading Apparatus:

A solder ball loading apparatus for loading very small (for example, less than 200 μm in diameter) solder balls 77 (i.e., metal balls having low melting point) on the connection pads of a multilayer printed wiring board will be described with reference to FIG. 12.

Figure 12:
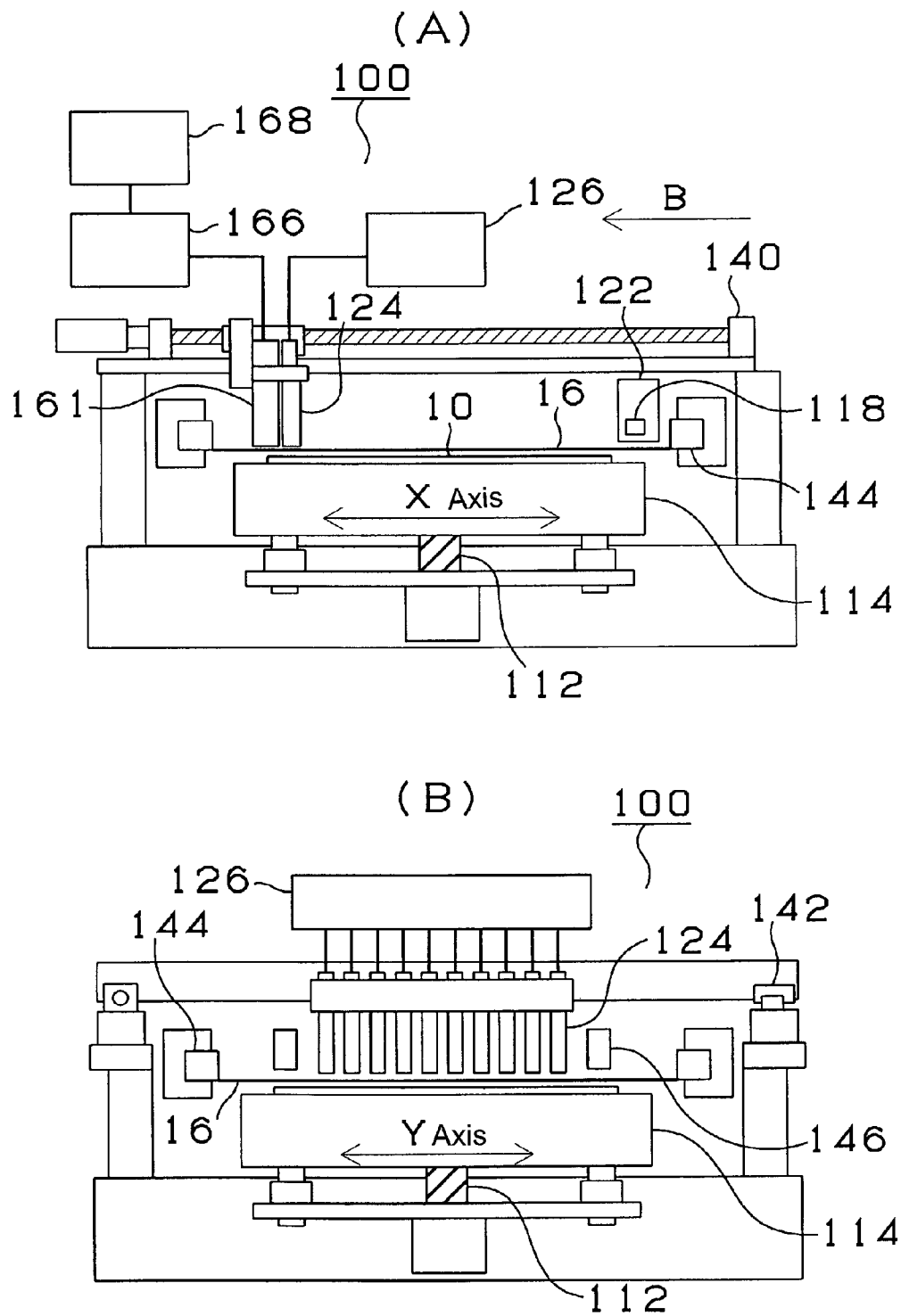
FIG. 12 (B) is another side cut-away view of the solder ball loading apparatus viewed in the direction of arrow B.

FIG. 12 (A) is a structural diagram illustrating the structure of a solder ball loading apparatus pertaining to one example in accordance with the present invention, and FIG. 12 (B) is another view of the solder ball loading apparatus in FIG. 12 (A) as viewed in the direction of the arrow B.

The solder ball loading apparatus 100 comprises an XYθ suction table 114 for positioning and holding a multilayer printed wiring board 10, a vertically-moving shaft 112 for lifting and lowering said XYθ suction table 114, a ball arrangement mask 16 provided with openings corresponding to the connection pads of the multilayer printed wiring board, a loading cylinder (a cylinder member) 124 for guiding solder balls, a suction box 126 for supplying the loading cylinder 124 with a negative pressure, a ball removing cylinder 161 for collecting excess solder balls, a suction box 166 for supplying said ball removing cylinder 161 with a negative pressure, a ball removing suction unit 168 for holding solder balls collected, a mask clamp 144 for clamping the ball arrangement mask 16, an X-direction-moving shaft 140 for sending the loading cylinder 124 and the ball removing cylinder 161 in the X direction, a moving-shaft support guide 142 for supporting the X-direction-moving shaft 140, an alignment camera 146 for photographing the multilayer printed wiring board 10, a remaining amount detecting sensor 118 for detecting the remaining amount of solder balls under the loading cylinder 124, and a solder ball supply unit 122 for supplying solder balls to the side of the loading cylinder 124 based on the remaining amount detected by the remaining amount detecting sensor 118.

Figure 9:
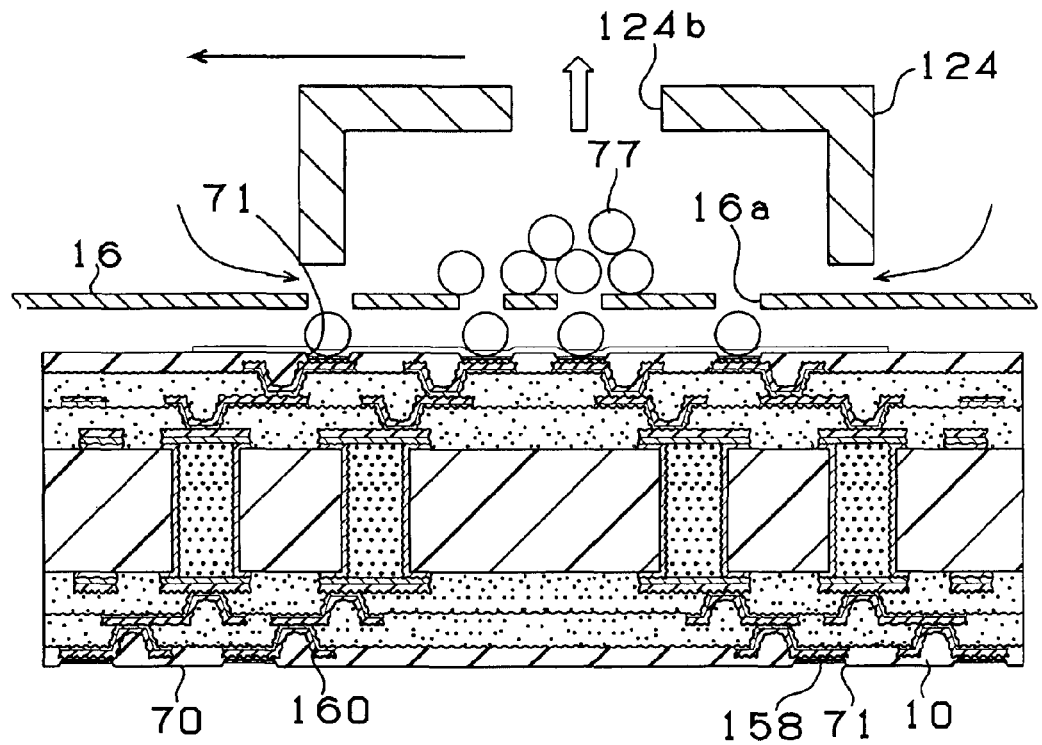
FIG. 9(A) is a side cut-away view of a multilayer printed wiring board in a step of a method of manufacturing the multilayer printed wiring board according to an embodiment of the present invention.
FIG. 9(B) is a side view of another step in the method of manufacturing the multilayer printed wiring board according to the embodiment of the present invention.
Figure 9:
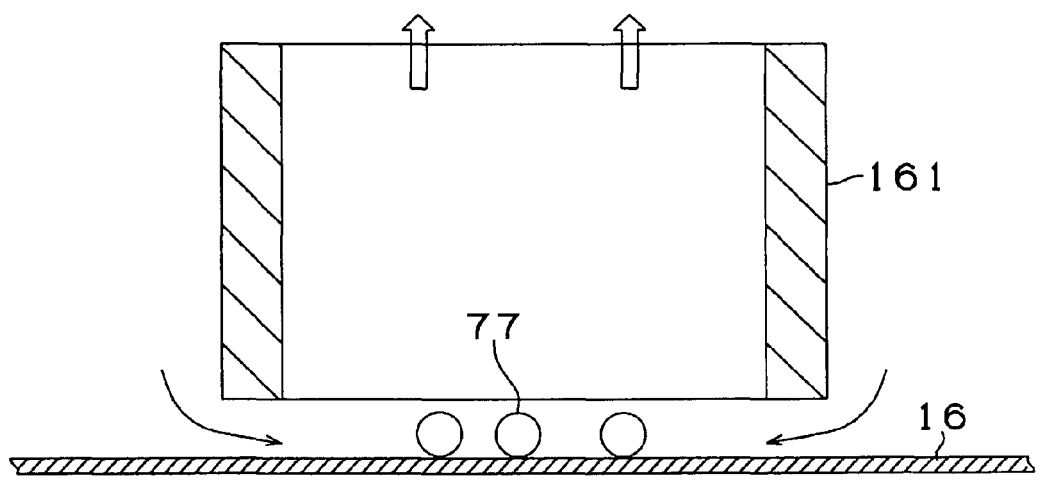
Figure 10:
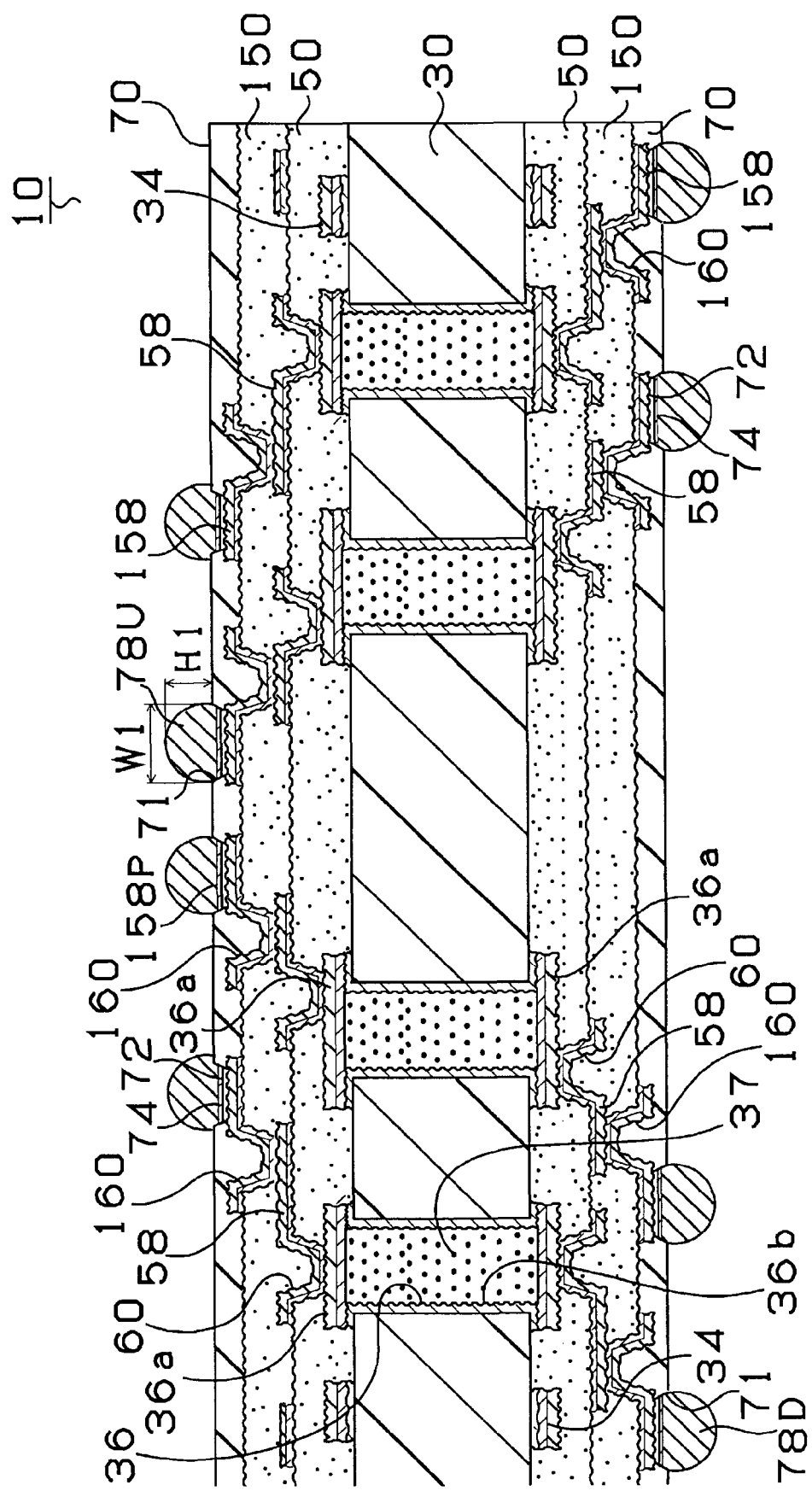
FIG. 10 is a side cut-away view of a multilayer printed wiring board according to an embodiment of the present invention.
Figure 11:
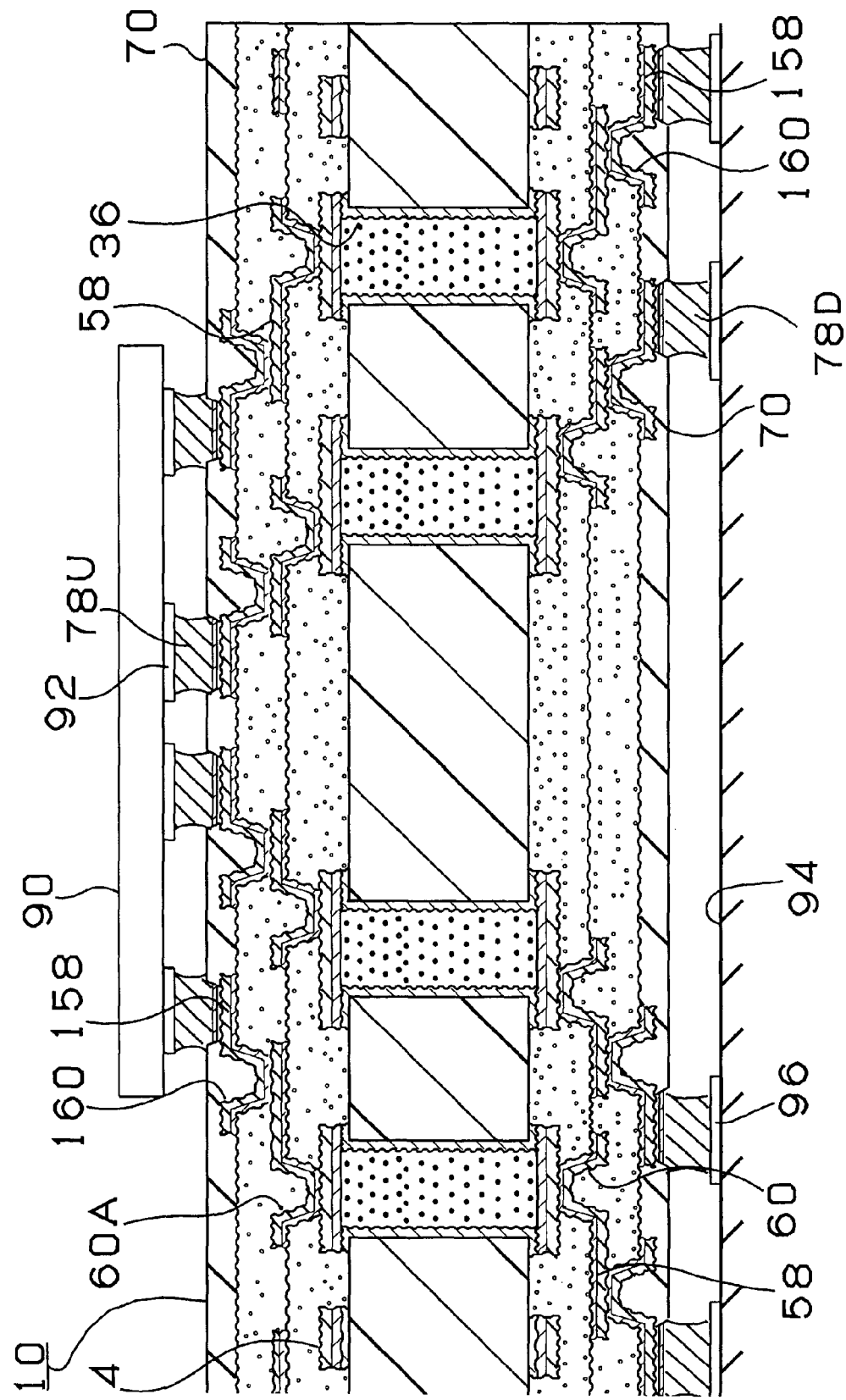
FIG. 11 is a side cut-away view of an embodiment of a multilayer printed wiring board including an IC chip according to an embodiment of the present invention.

Next, the structure of the multilayer printed wiring board 10 pertaining to the first example in accordance with the present invention will be described with reference to FIG. 1 through FIG. 11. FIG. 10 illustrates a sectional view of said multilayer printed wiring board 10, and FIG. 11 shows the condition of the multilayer printed wiring board illustrated in FIG. 10 attached to an IC chip 90 and a daughter board 94. As illustrated in FIG. 10, in the multilayer printed wiring board 10, there are formed conductive circuits 34 on the surfaces of a core substrate 30. The top face and the bottom face of the core substrate 30 are connected by way of through holes 36. On the core substrate 30 there are provided interlayer resin insulating layers 50 having via holes 60 and conductive circuits 58 formed thereon, and interlayer resin insulating layers 150 having via holes 160 and conductive circuits 158 formed thereon. On said via holes 160 and conductor circuits 158 there are formed solder resist layers 70. In the upper face side solder resist layer 70 there are formed openings 71 being W1=60 μm in diameter. Solder bumps 78U are formed in the openings 71. The height H1 of the solder bumps 78U (i.e., the height that the top of the solder bump protrudes above the top surface of the solder resist layer) is set to being about 30 μm. On the lower face side of the multilayer printed wiring board there are formed solder bumps 78D in the openings 71 of the solder resist layer 70. In addition, while the openings of the solder resist are formed in FIG. 10 such that a only a portion of the conductor circuits 158 is exposed, they may be formed such that a portion of the via holes 160 and all of the conductor circuits 158 are also exposed.

As illustrated in FIG. 11, the solder bumps 78U on the upper face side of the multilayer printed wiring board 10 are connected to the electrode pads 92 of an IC chip 90. Further, the solder bumps 78D on the lower face side are connected to the lands 96 of the daughter board 94.

Continuing on, the method of manufacturing a multilayer printed wiring board 10 described above with reference to FIG. 10 will be described with reference to FIG. 1 through FIG. 7.

Figure 1:
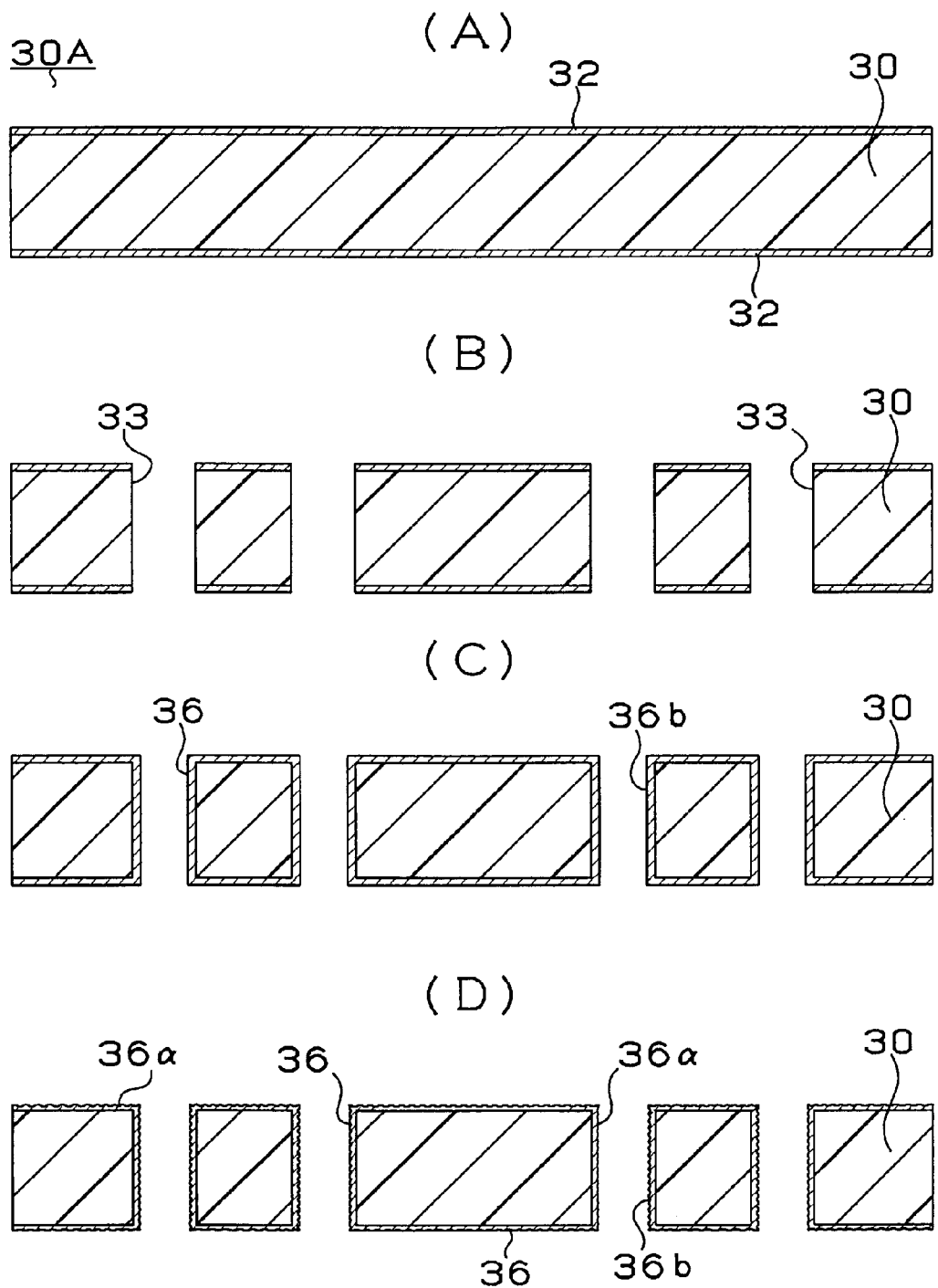
FIG. 1(A) is a side cut-away view of a multilayer printed wiring board in a step of a method of manufacturing the multilayer printed wiring board according to an embodiment of the present invention.
FIG. 1(B) is a side view of another step in the method of manufacturing the multilayer printed wiring board according to the embodiment of the present invention.
FIG. 1(C) is a side view of another step in the method of manufacturing the multilayer printed wiring board according to the embodiment of the present invention.
FIG. 1(D) is a side view of another step in the method of manufacturing the multilayer printed wiring board according to the embodiment of the present invention.

(1) A copper-foiled laminated board 30A is prepared by laminating a copper foil 32 having a thickness of 5 to 250 μm on both faces of an insulation substrate 30 made of a glass-epoxy resin or a BT (bismaleimide triazine) resin 0.2 to 0.8 mm in thickness, as shown in FIG. 1 (A). The copper-clad laminated board is drilled to bore through holes 33, as shown in FIG. 1 (B), and the through holes 33 are electroless-plated and electroplated to form side-wall conductor layers 36b, as shown in FIG. 1 (C).

(2) The substrate 30 having through holes 36 formed therein is washed with water and dried. Next, the substrate 30 undergoes a blacking process with an aqueous solution containing NaOH (10 g/l), NaClO$_2$ (40 g/l), and Na$_3$PO$_4$ (6 g/l) as a blacking bath (an oxidation bath) and a reduction process with an aqueous solution containing NaOH (10 g/l) and NaBH4 (6 g/l) as a reduction bath to form roughened faces 36a on the side-wall conductor layers 36b of the through holes 36 and the surfaces, as shown in FIG. 1 (D).

(3) Next, the through holes 36 are filled with a filler 37 containing copper particles by a screen printing process. An average particle diameter of the copper particles is 10 μm (for example, such as in DD PASTE, a non-conductive plugging copper paste made by Tatsuta Electric Wire & Cable Co., Ltd.) Further, the resulting substrate 30 is dried and hardened, as shown in FIG. 2 (A), such that a coating is given with a printing method on the substrate with a mask placed thereon and provided with openings at the through hole portions to be filled in the through holes, and following the filling the substrate is dried and hardened.

Figure 2:
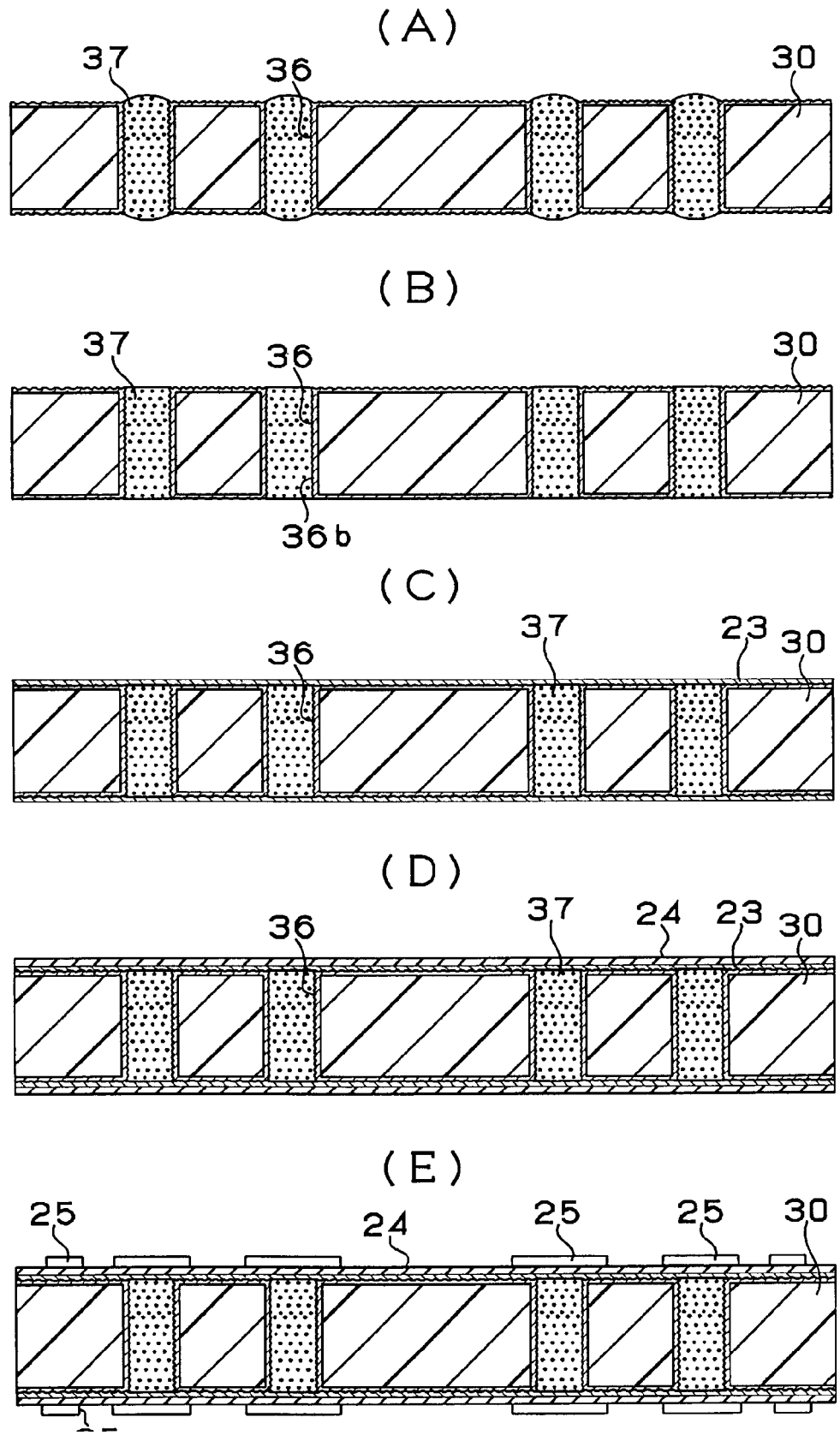
FIG. 2(A) is a side cut-away view of a multilayer printed wiring board in a step of a method of manufacturing the multilayer printed wiring board according to an embodiment of the present invention.
FIG. 2(B) is a side view of another step in the method of manufacturing the multilayer printed wiring board according to the embodiment of the present invention.
FIG. 2(C) is a side view of another step in the method of manufacturing the multilayer printed wiring board according to the embodiment of the present invention.
FIG. 2(D) is a side view of another step in the method of manufacturing the multilayer printed wiring board according to the embodiment of the present invention.
FIG. 2(E) is a side view of another step in the method of manufacturing the multilayer printed wiring board according to the embodiment of the present invention.

Excess filler 36 that oozed out of the through holes 36 is removed, for example by belt-sanding the surface with a #600 belt sanding paper (made by Sankyo Rikagaku Co., Ltd.), and, further, by buffing the surface to remove flaws created by the belt-sanding to thereby level the surfaces of substrate 30 (FIG. 2 (B)), to produce a substrate 30 wherein the side wall conductor layers 36b of the through holes 36 and the resin filler 37 are fixedly adhered via roughened layers 36a.

(4) A palladium catalyst is added to the surfaces of the substrate 30, which has been leveled under the above-described step (3), and which is electroless copper-plated to form electroless copper-plated films 23 of 0.6 μm in thickness, as shown in FIG. 2 (C).

(5) Then, an electrolytic copper plating is conducted under the following conditions to form electrolytic copper plated films 24 of 15 μm in thickness such that an added thickness for the portions to constitute conductor circuits 34 and the portions to constitute the cover plated layers (through-hole lands) covering the filler 37 filled in through holes 36 are formed, as shown in FIG. 2 (D).

Electrolytic Plating Aqueous Solution:

| | |
|---|---|
| Sulfuric acid | 180 g/l |
| Copper sulfate | 80 g/l |
| Additive (made by Atotec Japan, Product name: CAPARACID GL) | 1 ml/l |

Electrolytic Plating Conditions:

| | |
|---|---|
| Current density | 1 A/dm$^2$ |
| Time | 70 minutes |
| Temperature | Room temperature. |

(6) On both faces of the substrate 30 with the portions to constitute conductor circuits and cover plated layers formed thereon there are laminated commercially available photosensitive dry films. Further, the films are covered with masks and are exposed at 100 mJ/cm$^2$ and developed with 0.8% sodium carbonate to form etching resists 25 of 15 μm in thickness, as shown in FIG. 2 (E).

(7) Next, the plated films 23, 24 and the copper foils 32 at the portions where the etching resist 25 are not formed are dissolved and removed with an etching solution having cupric chloride as the main ingredient. Further, the etching resists 25 are stripped and removed with 5% KOH to form independent conductor circuits 34 and the cover plated layers 36a covering the filler 37, as shown in FIG. 3 (A).

(8) Next, on the surfaces of the cover plated layer 36a covering the conductor circuits 34 and the filler 37 a roughened layer (an uneven layer) 34b is formed that includes 2.5 μm in diameter a Cu—Ni—P alloy. Further, on the surface of the roughened layer 34b is formed an Sn layer having a thickness of 0.3 μm, as shown in FIG. 3 (B) (the Sn layer is not illustrated).

(9) On both faces of the substrate is formed an interlayer resin insulating layer 50, for example using a resin film for interlayer resin insulating layer (made by Ajinomoto Co., Inc.: Product Name: ABF-45SH) 50γ being slightly larger than the substrate being placed on the substrate and preliminarily pressure-bonded under the conditions of the pressure being 0.45 MPa, the temperature being 80° C., and the pressure-bonding time being 10 seconds and sheared, by being laminated with the use of a vacuum laminator by the following method, as shown in FIG. 3 (C). Namely, the resin film for interlayer resin insulating layer is fully pressure-bonded under the conditions of a vacuum of 67 Pa, pressure being 0.47 MPa, temperature 85° C., and the pressure-bonding time of 60 seconds, with a subsequently thermoset at 170° C. for 40 minutes.

Figure 3:
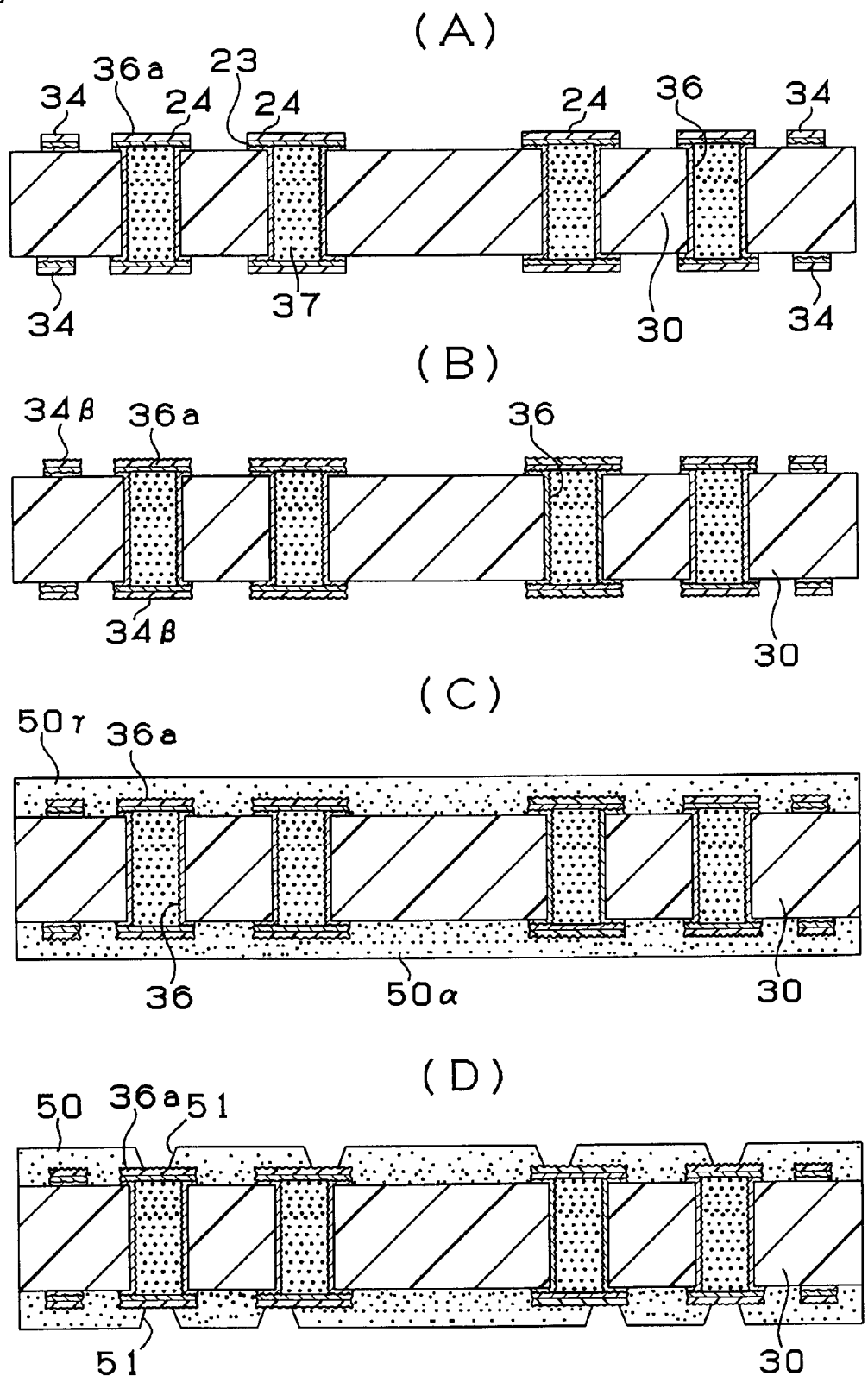
FIG. 3(A) is a side cut-away view of a multilayer printed wiring board in a step of a method of manufacturing the multilayer printed wiring board according to an embodiment of the present invention.
FIG. 3(B) is a side view of another step in the method of manufacturing the multilayer printed wiring board according to the embodiment of the present invention.
FIG. 3(C) is a side view of another step in the method of manufacturing the multilayer printed wiring board according to the embodiment of the present invention.
FIG. 3(D) is a side view of another step in the method of manufacturing the multilayer printed wiring board according to the embodiment of the present invention.

(10) Next, openings for via holes 51 are formed in the interlayer resin insulating layers 50 with a CO2 gas laser at the wavelength of 10.4 μm under the conditions of the beam diameter of 4.00 mm, a top hat mode, the pulse width of 3 to 30 μm, and 1 to 3 shots, to produce a configuration such as shown in FIG. 3 (D).

Figure 4:
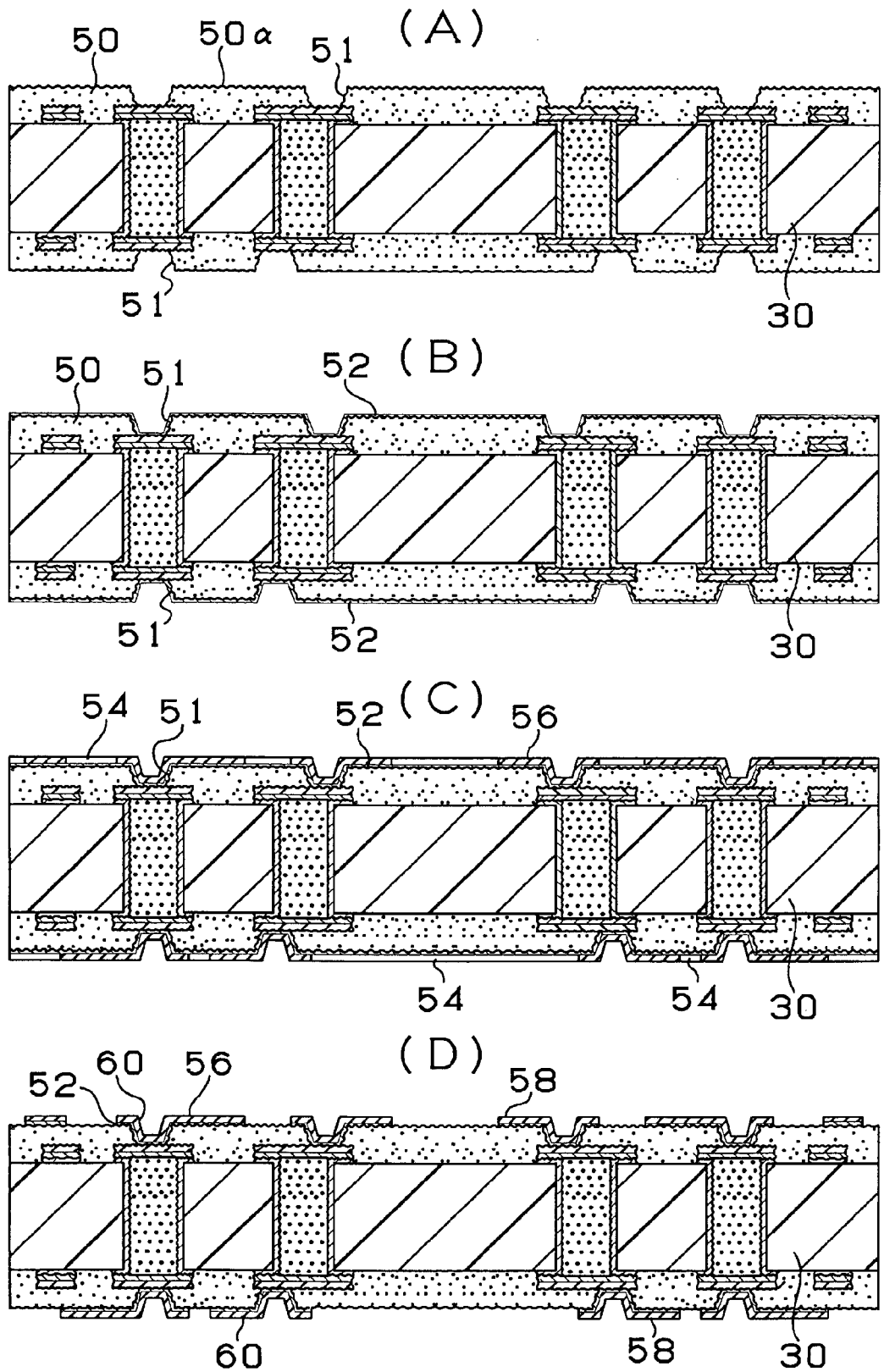
FIG. 4(A) is a side cut-away view of a multilayer printed wiring board in a step of a method of manufacturing the multilayer printed wiring board according to an embodiment of the present invention.
FIG. 4(B) is a side view of another step in the method of manufacturing the multilayer printed wiring board according to the embodiment of the present invention.
FIG. 4(C) is a side view of another step in the method of manufacturing the multilayer printed wiring board according to the embodiment of the present invention.
FIG. 4(D) is a side view of another step in the method of manufacturing the multilayer printed wiring board according to the embodiment of the present invention.

(11) The substrate having openings 51 for via holes is immersed in a solution containing 60 g/l permanganic acid at 80° C. for 10 minutes to remove particles present on the surfaces of the interlayer resin insulating layers 50 such that roughened faces 50a are formed on the surfaces of the interlayer resin insulating layers 50 inclusive of the inner walls of the openings for via holes 51, as shown in FIG. 4 (A).

(12) Next, the above-treated substrate is immersed in a neutralizing solution, for example a neutralizing solution made by Shipley Company, LLC. Subsequently, the substrate is washed with water.

Further, to the surfaces of the substrate which have been roughened (e.g., roughening depth being 3 μm) a palladium catalyst is added such that the catalyst nucleus adheres to the surfaces of the interlayer resin insulating layers and the inner wall surfaces of the openings for via holes. Namely, the above-described substrate is immersed in a catalyst solution containing palladium chloride (PbCl$_2$) and stannous chloride (SnCl$_2$) to allow palladium metal to deposit and provide the catalyst.

(13) Next, the substrate provided with the catalyst is immersed in a electroless copper plating aqueous solution (e.g., Thrucup PEA made by Uemura Industries Co., Ltd.) to form electroless copper plated films of 0.3 to 3.0 μm in thickness over all of each of the roughened surfaces to obtain a substrate wherein electroless copper plated films were formed on the surfaces of the interlayer resin insulating layers 50 inclusive of the inner walls of the openings for via holes 51, as shown in FIG. 4 (B).

Electroless Plating Conditions:
Liquid temperature at 34° C. for 45 minutes

(14) Commercially available photosensitive dry films are attached to the substrate on which electroless copper plated films 52 are formed and a mask is placed, and exposed at 110 mJ/cm$^2$ and developed with 0.8% sodium carbonate aqueous solution to provide plating resists 54 of 25 μm in thickness. Then, the substrate is washed with water at 50° C. to remove grease, and then washed with water at 25° C. and further washed with sulfuric acid. Subsequently, the substrate is electroplated under the following conditions to form electrolytic copper plated films 56 of 15 μm in thickness on the portions where the plating resists 54 had not been formed, as shown in FIG. 4 (C).

Electrolytic Plating Solution:

| | |
|---|---|
| Sulfuric acid | 2.24 mol/l |
| Copper sulfate | 0.26 mol/l |
| Additive | 19.5 mol/l |
| (e.g., made by Atotec Japan, Product Name: CAPRACID GL) | |

Electrolytic Plating Conditions:

| | |
|---|---|
| Current density | 1 A/dm$^2$ |
| Time | 70 minutes |
| Temperature | 22 ± 2° C. |

(15) Further, after the plating resists 54 are stripped and removed with 5% KOH, the electroless plating films below the plating resists is dissolved and removed by an etching process with a mixture solution of sulfuric acid and hydrogen peroxide to constitute independent conductor circuits 58 and via holes 60, as shown in FIG. 4 (D).

(16) Then, the same processing as in the above-described step (4) is conducted to form roughened faces 58a on the surfaces of the conductor circuits 58 and via holes 60. The thickness of the lower layer conductor circuit 58 is 15 μm, in the example shown in FIG. 5 (A). However, the lower layer conductor circuit may also be formed to have a thickness over a range of 5 to 25 μm.

Figure 5:
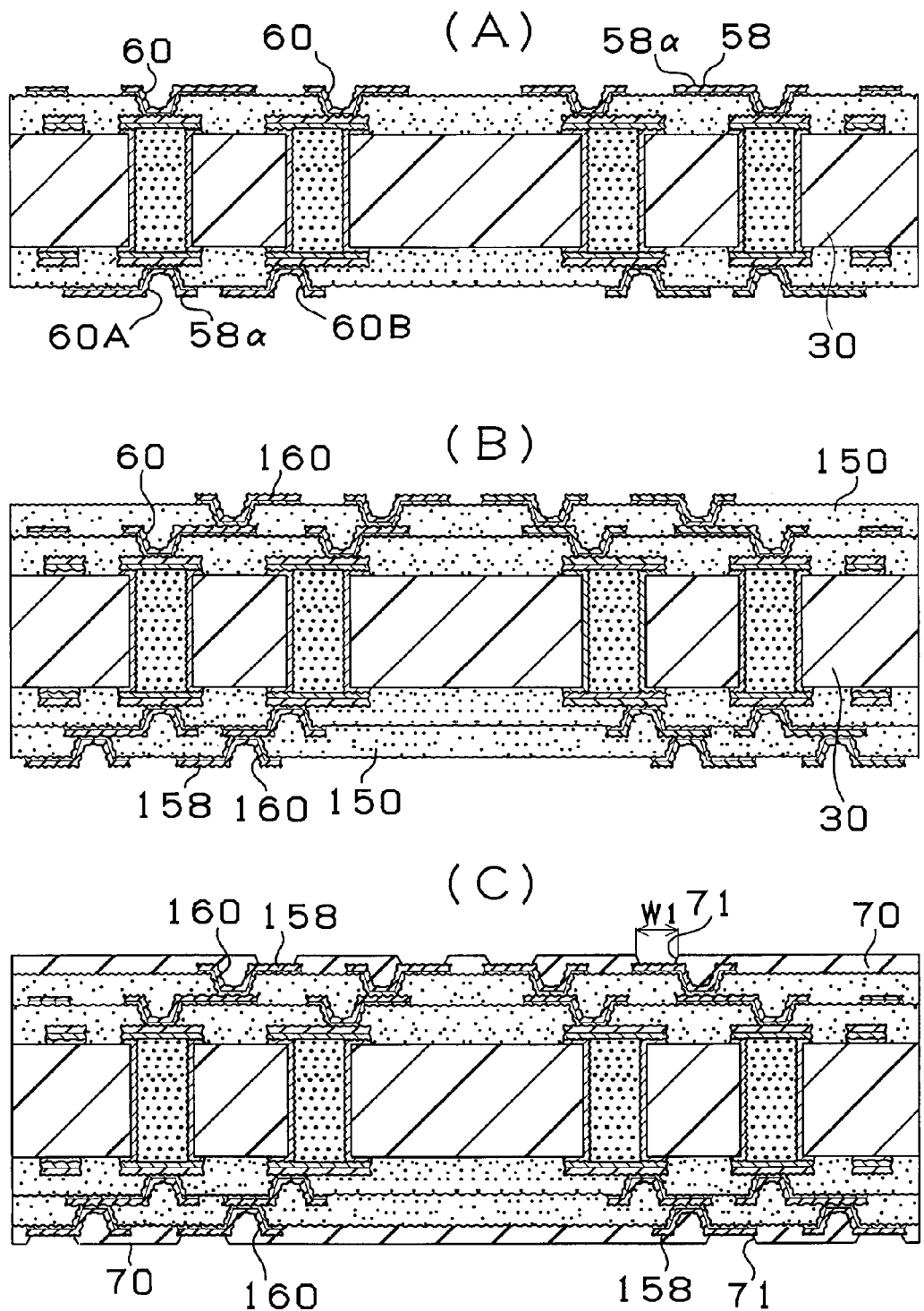
FIG. 5(A) is a side cut-away view of a multilayer printed wiring board in a step of a method of manufacturing the multilayer printed wiring board according to an embodiment of the present invention.
FIG. 5(B) is a side view of another step in the method of manufacturing the multilayer printed wiring board according to the embodiment of the present invention.
FIG. 5(C) is a side view of another step in the method of manufacturing the multilayer printed wiring board according to the embodiment of the present invention.

(17) By repeating the above-described steps (9) through (16), an interlayer insulating layer 150 having conductor circuits 158 having the thickness of 15 μm and via holes 160 is formed on a further upper layer to obtain a multilayer wiring board, as shown in FIG. 5 (B).

Figure 13:
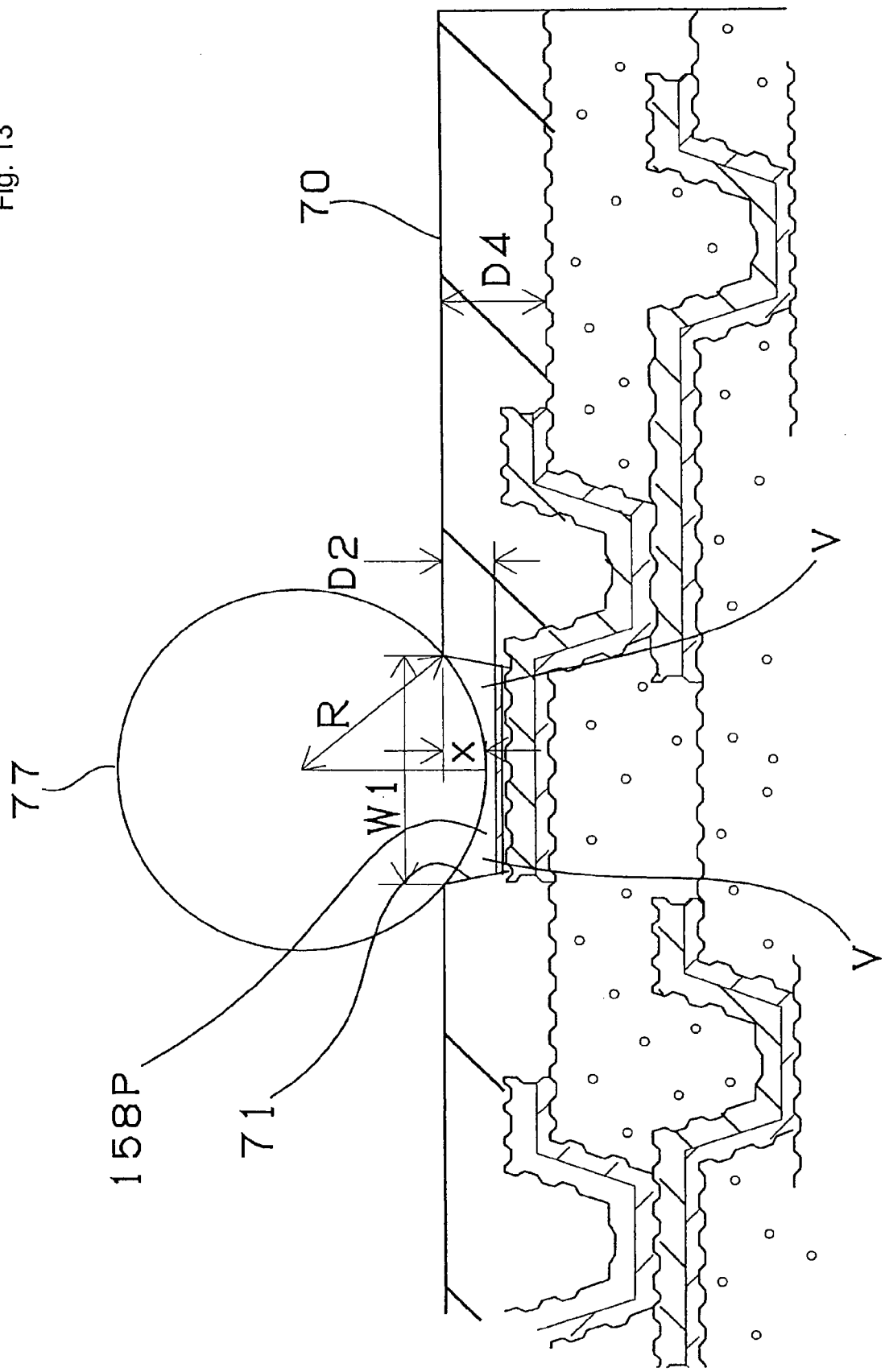
FIG. 13 is a side cut-away view of a condition in which a solder ball is loaded in an opening.

(18) Next, a solder resist (for example, a commercially available solder resist) composition 70 was coated in a thickness of 10 to 40 μm (refer to D4 in FIG. 13) on both faces of the multilayer wiring substrate, and after drying at 70° C. for 20 minutes and then at 70° C. for 30 minutes, a photo mask of 5 mm in thickness on which a pattern of the opening portion of the solder resist had been drawn is tightly adhered to the solder resist layer 70, and is exposed to an ultraviolet ray of 1,000 mJ/cm$^2$ and developed with a DMTG solution to form openings 71 of the diameter being W1=60 μm on the upper face side and openings 71 of the diameter being 200 μm on the lower face side, as shown in FIG. 5 (C).

Further, the solder resist layers are hardened by heat processes under the conditions of for one hour at 80° C., for one hour at 100° C., for one hour at 120° C., and for three hours at 150° C. each to form solder resist pattern layers of 30 μm in thickness having openings 71.

Figure 6:
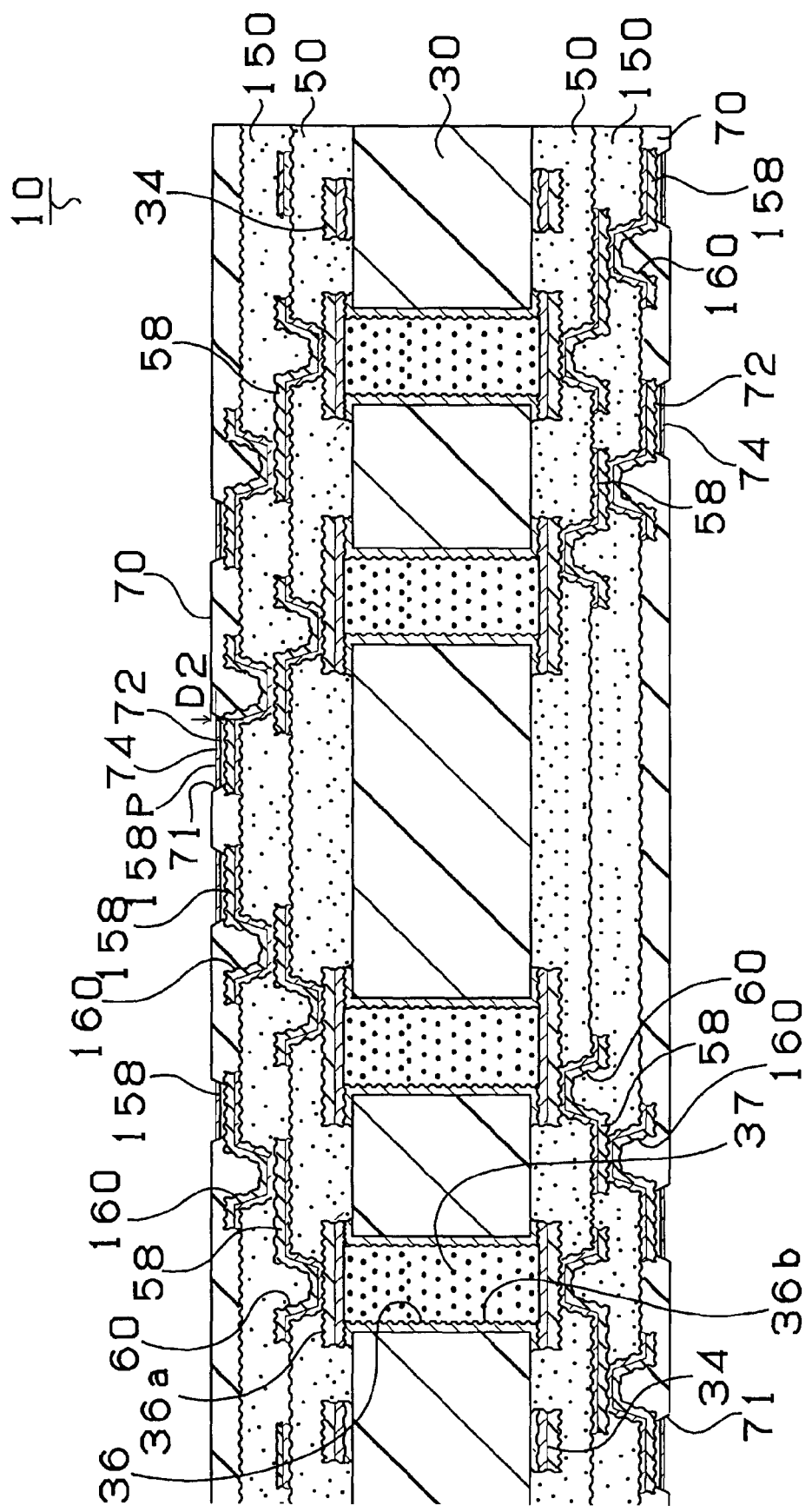
FIG. 6 is a side view of an embodiment of a multilayer printed wiring board according to the present invention.

(19) Next, the substrate on which solder resist layers 70 had been formed is immersed in an electroless nickel plating solution being pH=4.5 and containing nickel chloride (2.3×10$^{-1}$ mol/l), sodium hypophosphite (2.8×10$^{-1}$ mol/l), and sodium citrate (1.6×10$^{-1}$ mol/l) for 20 minutes to form nickel plated layers 72 of about 5 μm in thickness in the openings 71. Further, the substrate is immersed in an electroless gold plating solution containing potassium gold cyanide (7.6×10$^{-3}$ mol/l), ammonium chloride (1.9×10$^{-1}$ mol/l), sodium citrate (1.2×10$^{-1}$ mol/l), and sodium hypophosphite (1.7×10$^{-1}$ mol/l) under the conditions of for 7.5 minutes at 80° C. to form a gold plated layer 74 of about 0.03 μm in thickness on the nickel plated layers 72 (FIG. 6). Alternatively, a nickel-gold layer, a single layer of tin or a precious metal (gold, silver, palladium, platinum, etc.) may be formed. In this step, a nickel plated layer 72 and a gold plated layer 74 are provided on the conductor circuits 158 exposed from the openings 71 to form connection pads 158P. At this juncture, the thickness of the solder resist layers 70 is adjusted to 30 μm, as described above, and with the provision of about 5 μm of a nickel plated layer 72 and about 0.03 μm of a gold plated layer 74 on the conductor circuits 158 of 15 μm in thickness the depth (D2) from the upper edge of the openings 71 to the surface of the connection pads 158P (the surface of the gold plated layer 74) is set to 10 μm.

(20) A step of solder ball loading:
Continuing on, a step of loading solder balls onto the multilayer printed wiring board 10 with the solder ball loading apparatus 100 described above with reference to FIG. 12 will be described with reference to FIG. 7 through FIG. 9.

Figure 7:
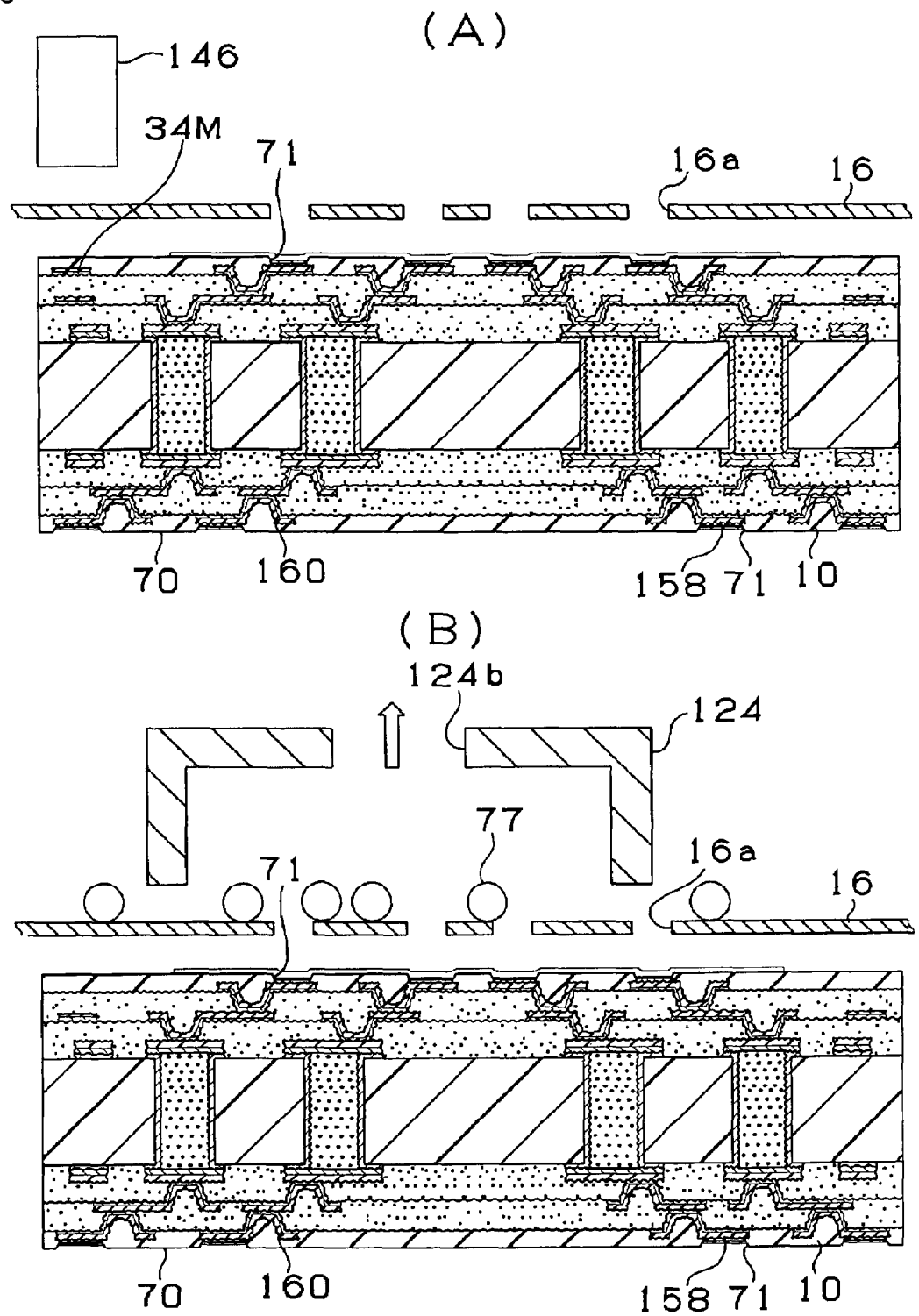
FIG. 7(A) is a side cut-away view of a multilayer printed wiring board in a step of a method of manufacturing the multilayer printed wiring board according to an embodiment of the present invention.
FIG. 7(B) is a side view of another step in the method of manufacturing the multilayer printed wiring board according to the embodiment of the present invention.

(I) Position recognition and correction of the multilayer printed wiring board:
The alignment mark 34M of the multilayer printed wiring board 10 is recognized with the alignment camera 146, as illustrated in FIG. 7 (A), such that the position of the multilayer printed wiring board 10 with respect to the ball arrangement mask 16 is corrected with the XYθ suction table 114. Namely, the position is adjusted such that each of the openings 16a of the ball arrangement mask 16 corresponds to each of the upper face openings 71 of the multilayer printed wiring board 10.

(II) Supply of solder balls:
As illustrated in FIG. 7 (B), the solder balls 77 (for example, 75 μm diameter, Sn63Pb37 solder balls made by Hitachi Metals, Ltd.) are supplied in a specified quantity from the solder ball supply unit 122 to the side of the loading cylinder 124. In addition, the solder balls 77 may in advance be supplied to be stored in the loading cylinder. While Sn/Pb solder balls are illustrated in this example, the present invention also applies to Pb-free solder balls selected from a group of Sn and Ag, Cu, In, Bi, Zn, etc.

(III) Loading of solder balls:
The loading cylinder 124 is positioned above the ball arrangement mask 16 while maintaining a predetermined clearance (for example, 0.5 to 4 times the ball diameter) from the ball arrangement mask, as illustrated in FIG. 8 (A), and air is suctioned from the suction portion 124b such that the flow velocity at the gap between the loading cylinder and the top surface of the ball arrangement mask is set to 5 m/sec to 35 m/sec to allow the solder balls 77 to gather on the ball arrangement mask 16 directly below the opening portion 124A of said loading cylinder 124.

Figure 8:
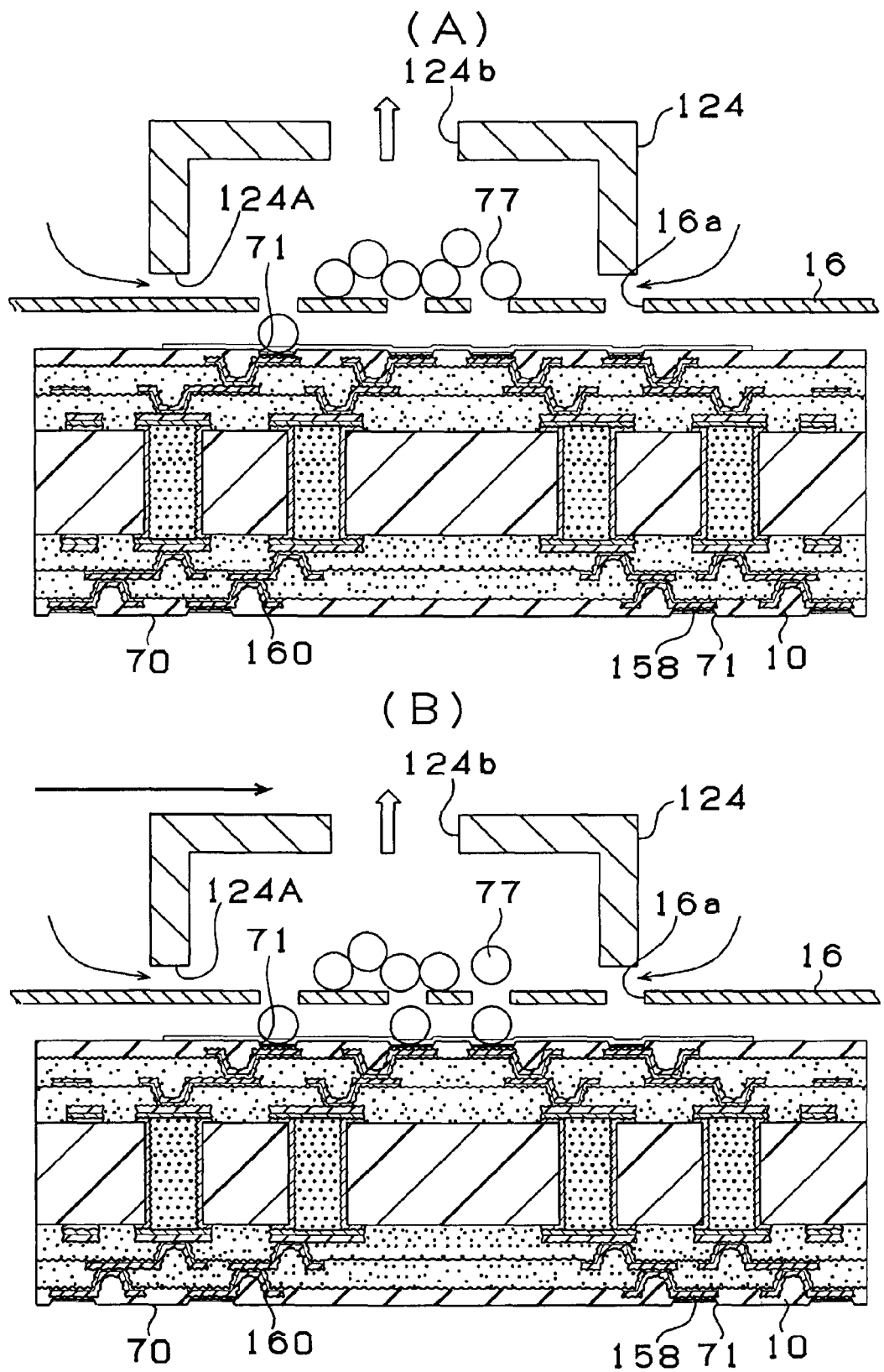
FIG. 8(A) is a side cut-away view of a multilayer printed wiring board in a step of a method of manufacturing the multilayer printed wiring board according to an embodiment of the present invention.
FIG. 8(B) is a side view of another step in the method of manufacturing the multilayer printed wiring board according to the embodiment of the present invention.

Subsequently, the loading cylinders 124 lined up along the Y axis of the multilayer wiring board 10 as illustrated in FIG. 8 (B) and FIG. 9 (A) as well as FIG. 12 (B) and FIG. 12 (A) are moved in a horizontal direction along the X axis via the X-direction moving shaft 140. As such, the solder balls 77 gathered on the ball arrangement mask 16 are moved with the movement of the loading cylinders 124 such that they are dropped via the openings 16a of the ball arrangement mask 16 and loaded into the upper face openings 71 of the multilayer printed wiring board 10. As such, the solder balls 77 are successively arranged on all (or essentially all) the connection pads on the side of the multilayer printed wiring board 10.

Although the loading cylinders 124 are moved in this example, the invention also includes moving the multilayer printed wiring board 10 and the ball arrangement mask 16 with the loading cylinders 124 being held stationary such that the solder balls 77 gathered directly below the loading cylinders 124 are loaded into the openings 71 of the multilayer printed wiring board 10 via the openings 16a of the ball arrangement mask 16.

(IV) Removal of adhering solder balls:
The excess solder balls 77 are guided by the loading cylinders 124 to the locations where there are no openings 16a on the ball arrangement mask 16 to suction out and remove them with the ball removal cylinder 161.

(21) Then, the solder balls on the upper face are melted by reflow at 230° C. to form solder bumps 78U of about 30 μm in height (H1) out of the solder balls 77 loaded into the openings 71 on the upper face (FIG. 9(A)). At that time, the distance between the solder balls 77 loaded into the openings 71 and the connection pads 158P is brought closer with the adjustment of the thickness of the solder resist layer 70 such that the connection between the solder bumps 78U and the connection pads 158P is made easily obtainable upon reflow of the solder balls 77. Particularly, since the thickness of the solder resist layer 70 is adjusted such that the solder balls 77 are in contact with the connection pads 158P as they sit loaded in the openings 71, the connection between the solder bumps 78U and the connection pads 158P can be more reliably obtained. In addition, solder bumps 78D are formed on the lower face.

(22) And, an IC chip 90 is placed onto the multilayer printed wiring board 10 and the connection pads of the printed wiring board and the electrodes 92 of the IC chip 90 are connected via the solder bumps 78U. Then, the multilayer printed wiring board 10 is attached to a daughter board 94 via the solder bumps 78D (FIG. 11).

And, according to the present example, with the loading cylinders 124 being positioned above the ball arrangement mask 16 the solder balls 77 are gathered by air being suctioned out of said loading cylinders 124 and the solder balls 77 gathered directly below the loading cylinders 124 are moved such that they are on the ball arrangement mask 16 by the loading cylinders 124 or the printed wiring board and the ball arrangement mask 16 being moved relative to each other and dropped into the openings 71 of the multilayer printed wiring board 10 via the openings 16a of the ball arrangement mask 16. At that time, since the depth from the upper edge of the openings 71 to the connection pads 158P is made shallow such that the solder balls 77 could not easily get caught at the upper edge face of the openings 71, fine solder balls 77 may be more reliably loaded into all of the small-diameter openings 71 of the multilayer printed wiring board 10. And, since the solder balls are moved without contacting a moving device such as a squeegee, the solder balls can be loaded into small-diameter openings 71 without being damaged (or with minimized damage), resulting in an even height of the solder bumps 78, unlike the situation where a squeegee is used. Further, since the solder balls are guided by suction force, the sticking or clinging of solder balls can be prevented or reduced.

It is preferred that the depth D2 from the upper edge of the openings 71 to the connection pads 158P is adjusted by the thickness D4 of the solder resist layer 70 such that the solder balls 77 are in contact with the connection pads 158P. This relation will be described with reference to FIG. 13. Here, provided that the opening diameter is W1 (the opening radius) and the radius of the solder ball 77 is R, the distance X from the upper edge of the openings 71 to the lower edge of the solder balls 77 is expressed by the following equation.

$$X = R - \sqrt{R^2 - (W/2)^2}$$

Therefore, it is preferred that the thickness D4 of the solder resist layer 70 is adjusted such that the depth D2 from the upper edge of the openings to the surface of the connection pads is not greater than the distance X.

And, in order to minimize the cavity portion V present between the solder balls 77 and the connection pads 158, it is preferred that the distance X is relatively short. This is because air in said cavity portion should to be evacuated out of the solder bumps to turn the solder balls 77 to solder bumps by reflow. If air present in the cavity portion V cannot be evacuated out of the solder bumps, it may result in a poor adhesion between a connection pad and a solder bump and in the occurrence of a void within a solder bump. There is occasionally a problem when a solder bump cannot be formed on a connection pad. The larger the cavity portion V is, the more likely such a problem is to occur.

FIG. 14 shows test results on the yield when the solder balls 77 are loaded onto 2,500 C4 connection pads with the use of a solder ball loading apparatus described above with reference to FIG. 12 as the solder resist layer thickness, the opening diameter, and the solder ball diameter are varied.

These results confirm that the depth D2 from the upper edge of the openings to the surfaces of the connection pads to be exposed is preferably no greater than 18 μm. It is thought that this is because solder balls become susceptible to getting caught at the upper edge face of the solder resist openings such that they on occasions could not be loaded in the openings when the depth X is great. Alternately, when D2 is less than 3 μm, the ability as a dam drops, while the loadability of solder balls presents no problem, resulting in an increased likelihood that the solder will flow out when the solder balls are reflowed such that it comes in contact with the solder of an adjacent connecting pad causing on occasions short-circuiting. And, when the substrate is being moved following the solder balls having been loaded, the solder balls which have already been loaded could bounce over the solder resist leading to the presence of connection pads on which solder balls are not loaded. Accordingly, the range of the depth D2 is preferably 3 to 18 μm. Further, as the inside of the solder bumps observed by X rays when D2 being 3, 7, 15, and 20 μm, while no void was observed inside the bumps for D2=3, 7, and 15 μm, a void was observed inside the bumps for D2=20 μm. In addition, with respect to this example, while the solder balls were loaded with the apparatus illustrated in FIG. 12, the invention also includes loading solder balls by a method of picking up and loading solder bumps onto connection pads as disclosed in the Japanese Laid-Open Patent Publication No. Hei 3-265150, Japanese Laid-Open Patent Publication No. 2000-77837, and Japanese Laid-Open Patent Publication No. Hei 8-20682, etc., the entire contents of which are incorporated herein by reference.

The invention claimed is:
1. A method of manufacturing a printed wiring board having at least one solder bump thereon, the method comprising:
    forming a solder resist layer on a conductor layer, the solder resist layer having at least one opening that exposes a connection pad of the conductor layer, the at least one opening in the solder resist layer having a depth D, from the solder resist layer to the exposed connection pad, of from 3 μm to 18 μm, wherein the depth D of the opening in the solder resist layer is selected and meet the following equation:

$$D \leq R - \sqrt{R^2 - (W/2)^2}$$

wherein R is a radius of the solder ball and W is a diameter of the at least one opening in the solder resist layer;
    loading a solder ball into each of the at least one opening in the solder resist layer; and forming a bump on the exposed connection pad by heating the solder ball to a reflow temperature.

2. The method of claim 1, wherein the loading includes arranging the solder ball to be in contact with the exposed connection pad before said forming.

3. The method of claim 1, wherein a diameter of the solder ball is less than 200 μm.

4. The method of claim 1, wherein said loading comprises:
arranging a mask over the solder resist layer so that an opening portion in the mask is aligned with each of the at least one opening in the solder resist layer;
positioning a cylinder member having an opening facing the mask;
gathering multiple solder balls below the cylinder member by sucking air through the opening of the cylinder member; and
moving the cylinder member or moving the printed wiring board and the mask in order to load one of the gathered multiple solder balls into the at least one opening of the solder resist layer through the at least one opening portion in the mask.

5. The method of claim 4, further comprising:
holding the cylinder member in a stationary position on a vertical axis while moving the printed wiring board and the mask in a horizontal plane substantially orthogonal to the axis.

6. The method of claim 4, further comprising:
holding the printed wiring board and the mask in a stationary position on a vertical axis while moving the cylinder member in a horizontal plane substantially orthogonal to the axis.

7. The method of claim 4, wherein the sucking air through the opening of the cylinder includes sucking air such that a velocity of the air at a gap between a bottom of the cylinder member and an upper surface of the mask is 5 m/sec to 35 m/sec.

8. The method of claim 1, wherein:
said forming comprises forming the at least one opening to have a diameter of 60 μm; and
said loading comprises loading a solder ball having a diameter of 70 μm.

9. The method of claim 1, wherein:
said forming comprises forming the at least one opening to have a diameter of 80 μm; and
said loading comprises loading a solder ball having a diameter of 110 μm.

10. The method of claim 1, wherein:
said forming comprises forming a solder resist layer having a plurality of openings each having said depth D and exposing a respective connection pad; and
loading a solder ball into each of the plurality of openings.

11. A method of manufacturing a printed wiring board having at least one solder bump thereon, the method comprising:
forming a solder resist layer having at least one opening that exposes a connection pad, the at least one opening in the solder resist layer having a depth D from the solder resist layer to the exposed connection pad;
loading a solder ball into each of the at least one opening in the solder resist layer; and
forming a bump on the exposed connection pad by heating the solder ball to a reflow temperature,
wherein the depth D of the opening in the solder resist layer is selected and meet the following equation:

$$D \leq R - \sqrt{R^2 - (W/2)^2}$$

where R is a radius of the solder ball and W is a diameter of the opening in the solder resist layer.

12. The method of claim 11, wherein a diameter of the solder ball is less than 200 μm.

13. The method of claim 11, wherein the loading comprises:
arranging a mask over the solder resist layer so that an opening portion in the mask is aligned with each of the at least one opening in the solder resist layer;
positioning a cylinder member having an opening facing the mask;
gathering multiple solder balls below the cylinder member by sucking air through the opening of the cylinder member; and
moving the cylinder member or moving the printed wiring board and the mask in order to load one of the multiple solder balls into the at least one opening of the solder resist layer through the at least one opening portion in the mask.

14. The method of claim 13, further comprising:
holding the cylinder member in a stationary position on a vertical axis while moving the printed wiring board and the mask in a horizontal plane substantially orthogonal to the axis.

15. The method of claim 13, further comprising:
holding the printed wiring board and the mask in a stationary position on a vertical axis while moving the cylinder member in a horizontal plane substantially orthogonal to the axis.

16. The method of claim 13, wherein the sucking air through the opening of the cylinder includes sucking air such that a velocity of the air at a gap between a bottom of the cylinder member and an upper surface of the mask is 5 m/sec to 35 m/sec.

17. The method of claim 11, wherein:
said forming comprises forming a solder resist layer having a plurality of openings each having said depth D and exposing a respective connection pad; and
loading a solder ball into each of the plurality of openings.

* * * * *